(12) United States Patent
Itoh

(10) Patent No.: US 7,738,080 B2
(45) Date of Patent: Jun. 15, 2010

(54) STAGE APPARATUS, METHOD FOR CONTROLLING THE SAME, EXPOSURE APPARATUS, AND METHOD FOR MANUFACTURING DEVICE

(75) Inventor: Satoru Itoh, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 344 days.

(21) Appl. No.: 11/687,798

(22) Filed: Mar. 19, 2007

(65) Prior Publication Data

US 2007/0229794 A1 Oct. 4, 2007

(30) Foreign Application Priority Data

Mar. 30, 2006 (JP) .............................. 2006-095850

(51) Int. Cl.
*G03B 27/62* (2006.01)
(52) U.S. Cl. .............................. 355/72; 355/53; 355/75; 318/632; 318/649; 310/12.01; 310/12.06
(58) Field of Classification Search .................... 355/53, 355/72, 75, 77; 318/560, 632, 649; 310/10, 310/12–14, 12.01
See application file for complete search history.

(56) References Cited

U.S. PATENT DOCUMENTS

| | | | |
|---|---|---|---|
| 5,172,160 A | 12/1992 | Van Eijk et al. | |
| 5,260,580 A | 11/1993 | Itoh et al. | |
| 5,684,856 A | 11/1997 | Itoh et al. | |
| 6,072,183 A | 6/2000 | Itoh et al. | |
| 6,414,742 B1 | 7/2002 | Korenaga et al. | |
| 6,504,160 B2 | 1/2003 | Itoh et al. | |
| 2002/0104950 A1* | 8/2002 | Mayama ...................... | 248/638 |
| 2005/0156552 A1* | 7/2005 | Sekiguchi .................... | 318/575 |
| 2005/0254036 A1* | 11/2005 | Sasaki et al. .................. | 355/72 |
| 2006/0017908 A1* | 1/2006 | Mayama ...................... | 355/72 |
| 2006/0082754 A1* | 4/2006 | Sasaki et al. .................. | 355/72 |

FOREIGN PATENT DOCUMENTS

| | | |
|---|---|---|
| JP | 5-077126 | 3/1993 |
| JP | 5-121294 | 5/1993 |
| JP | 11-190786 | 7/1999 |
| JP | 2005354022 A * | 12/2005 |

* cited by examiner

*Primary Examiner*—Edward J Glick
*Assistant Examiner*—Colin Kreutzer
(74) *Attorney, Agent, or Firm*—Fitzpatrick, Cella, Harper & Scinto

(57) ABSTRACT

A stage apparatus includes a base, a stage that can move on a surface of the base, a first imparting unit arranged inside the base, which has a mass body and an actuator that is fixed to the base and moves the mass body in a direction vertical to the surface, the first imparting unit being configured to apply a force to the base by moving the mass body, and a controlling unit that controls the movement of the mass body in the vertical direction in the first imparting unit in accordance with movement of the stage, so that a force, which is generated in the base by the movement of the stage in a rotational direction around an axis parallel to the surface, is reduced.

12 Claims, 12 Drawing Sheets

F I G. 3
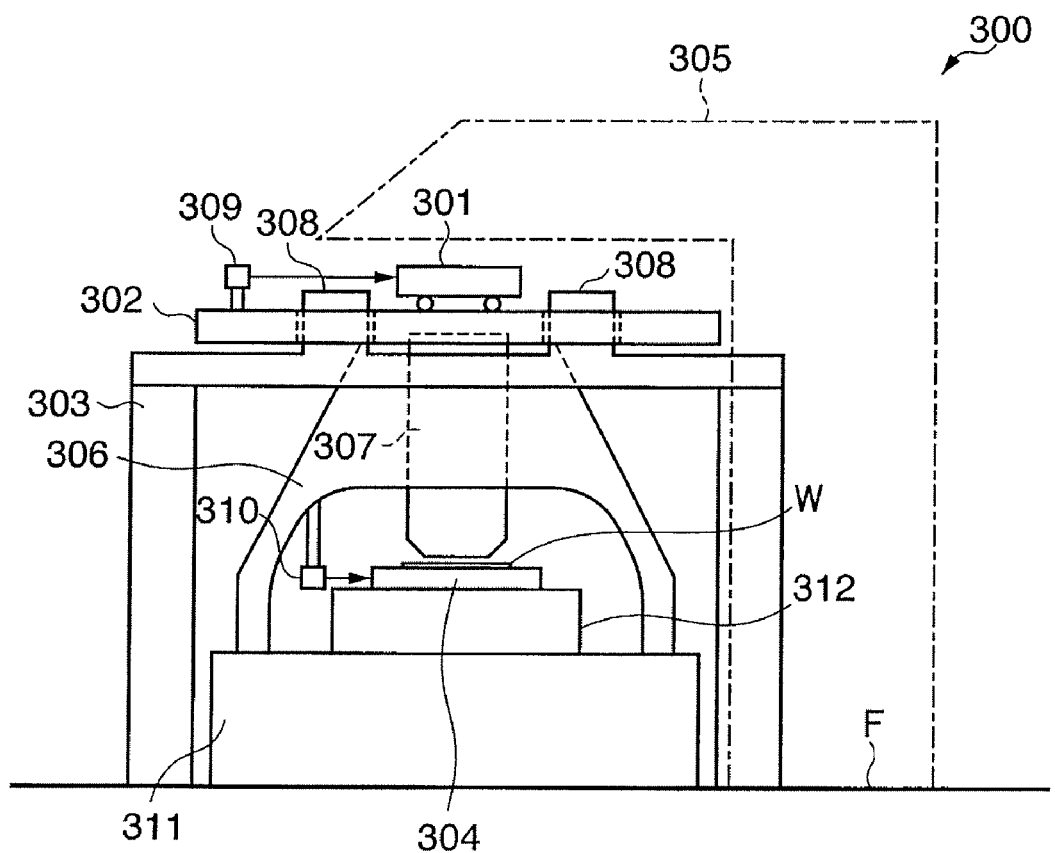

STAGE APPARATUS, METHOD FOR CONTROLLING THE SAME, EXPOSURE APPARATUS, AND METHOD FOR MANUFACTURING DEVICE

This application claims the benefit of Japanese Patent Application No. 2006-095850, filed Mar. 30, 2006, which is hereby incorporated by reference herein in its entirety.

BACKGROUND OF THE INVENTION

1. Field of the Invention

The present invention relates to a stage apparatus that is suitable for performing precision positioning. More specifically, the present invention relates to a stage apparatus that is used for a semiconductor exposure apparatus and, on which a wafer, or the like, is mounted. More specifically, the present invention relates to an exposure apparatus that uses such a stage apparatus, and relates to a device manufacturing method for manufacturing a device, such as a semiconductor device, by using such an exposure apparatus.

2. Description of the Related Art

For an exposure apparatus used for manufacturing a device, such as a semiconductor device, a step-and-repeat type exposure apparatus (also referred to as a stepper), or a step-and-scan type exposure apparatus (also referred to as a scanner), is typically used. A step-and-repeat type exposure apparatus moves a substrate (such as wafer and a glass substrate) in stepped movements, so that an original plate (such as a reticle and a mask) pattern can be projected through a projection optical system, and sequentially exposed onto a plurality of exposure areas on the substrate. A step-and-scan type exposure apparatus repeats exposure and transfer on a plurality of exposure areas on a substrate by repeating a step movement and a scanning exposure. In a step-and-scan type exposure apparatus, in particular, exposure light used is limited to a portion relatively near the optical axis of the projection optical system because of a slit. Thus, it is possible to expose a minute pattern precisely and with a wide angle of field.

FIG. 1 is an illustration that shows a schematic structure of a typical exposure apparatus. A base 105 is supported on anti-vibration units 106 on a floor F, and a wafer stage 104, which is movable in two-dimensional directions (directions X and Y), is supported on the base 105. A projection optical system 103 is supported above the wafer stage 104 and a reticle stage 102 is supported further above, with a main body supporting component (not shown). The reticle stage 102 supports a reticle R, and a lighting system 101 for supplying an exposure light is positioned above the reticle stage 102.

In the structure explained above, the wafer stage 104, which has a wafer W, which has been supplied with a wafer transfer system (not shown), mounted on it, is moved on the base 105 in the directions X and Y by an XY driving mechanism (not shown). In an exposure operation, the wafer stage 104 is moved by the XY driving mechanism so that the wafer W is positioned at a target position (exposure location) with respect to the reticle R. After completion of positioning, an image of the reticle R is printed on the wafer W. When printing is complete, the wafer stage 104 is driven so that the next exposure location of the wafer W can be exposed. An exposure apparatus in FIG. 1 prints reticle images on the single wafer W in its entirety, by repeating the above-mentioned steps.

In an exposure apparatus mentioned above, it is necessary to shorten the time required for moving and the time required for exposing the wafer stage 104, to improve productivity. In order to shorten the time required for moving the wafer stage 104, the acceleration and deceleration during movement must be increased. Meanwhile, the diameter of the wafer W needs to be increased to improve productivity of the post process steps, which is causing a growing increase in the mass of a wafer chuck and of the wafer stage 104.

In such an exposure apparatus, when a stage is driven, a reaction force of an inertia force is generated as the stage accelerates and decelerates, and if the reaction force is transferred to the base 105, the base 105 can vibrate. Such vibrations may prevent high-speed and precise positioning, since they may excite natural oscillation of the mechanism of the exposure apparatus and cause high-frequency oscillation. For this reason, several proposals have been made so that issues related to such a reaction force can be solved. For example, an apparatus described in Japanese Laid-Open Publication No. H5-77126A prevents a reaction force from causing vibration of a stage base by having a stator of a linear motor for driving the stage supported on the floor independently of the stage base. In an apparatus described in Japanese Laid-Open Publication No. H5-121294A, vibrations of the apparatus caused by a reaction force are reduced by providing a machine frame that supports a wafer stage and a projection lens with a compensating force that is equivalent to the reaction force generated when the stage is driven, using the force of the actuator generated in the horizontal direction.

However, in both of the above-mentioned conventional methods, although vibrations of the stage apparatus itself can be reduced, the reaction force generated when the stage is driven is transferred directly to the floor or transferred to the floor through a component that can be practically regarded as being integrated with the floor. This can vibrate the floor, which can vibrate and give adverse impacts on devices installed near the exposure apparatus. Generally, floors on which an exposure apparatus is installed have a natural frequency in the approximate range of 20 to 40 Hz. If an operation of the exposure apparatus excites vibrations in the natural frequency of the floor, there will be a significant adverse impact on the devices nearby.

In these days, acceleration of the stage has been increasing as the throughput speed improves, and, furthermore, mass of the stage has been increasing as reticles and substrates become larger. In response to this, the driving force, which is calculated by multiplying "mass of the moving unit" by "acceleration," has become significantly large with its reaction force, also to become enormous. As the reaction force increases, the issue of vibrations that the reaction force apply to the installation floor must be addressed.

In addition, increases in the size of the apparatus are notable, and the issue of increases in the area required for installation, within a manufacturing plant in which numerous manufacturing devices are installed, has started to manifest. Furthermore, if vibrations transferred to the floor from an apparatus, as mentioned above, are large, it is necessary to assure a larger distance between devices to prevent effects of vibrations from being transferred to other devices. Upsizing of the apparatus and security of a distance between devices cause a significant increase in the area practically occupied by each of the devices.

Although the anti-vibration units 106 are typically provided between the floor F and the base 105, it is impossible to avoid transfer to the floor of the reaction force, which is generated when the stage 104 is driven, with a conventional device for receiving reaction forces. For example, the moments around the X axis and the Y axis generated when the wafer stage 104 moves within the XY plane are transferred to the floor F.

As shown in FIG. 2, a structure that reduces transfer of vibrations to a floor F by combining anti-vibration units 106 and a post 221 has been proposed. In FIG. 2, transfer of the vibrations of a base 105 to the floor F is reduced by providing the anti-vibration units 106 between the base 105 and the floor F, and fixing the floor F and the base 105 through the post 221. However, even with such a structure, it is impossible to avoid transfer to the floor F of the reaction force that is generated when the stage is driven.

As shown in FIG. 2, when a wafer stage 104 with a mass of m moves at an acceleration of a, an internal force m·a in a plane and a moment force M=L·m·a acts on the floor face. The value L represents the distance between the position of the center of gravity of the movable stage and the floor face. In general, since the floor face has a high stiffness against the internal force in a plane, but has a low stiffness against the moment force, the above-mentioned moment force: M=L·m·a causes the floor to vibrate. The vibrations of the floor have adverse effects on the apparatus itself and the surrounding devices.

For a driving device in which the center of gravity of the base that supports the stage does not match the center of gravity of the stage, the applicant of the present invention considers it effective to provide a driving device with a reaction force counter that reduces the force transferred outside. However, even in an apparatus to which the reaction force counter is provided, unless the center of gravity of the stage and that of the base match each other on the YZ plane or on the ZX plane, moments are generated around the X axis or around the Y axis, and they are transferred to the floor.

For a driving device in which the center of gravity of the base that supports the stage does not match the center of gravity of the stage, a device described in Japanese Laid-Open Publication No. H11-190786A uses a rotating body as a method for reducing or canceling out the moments generated when the stage moves.

The use of a rotating body, however, requires an installation area equivalent to the diameter of the rotating body, both in the direction Y and in the direction Z, of the YZ plane for when the moment is generated around the X axis. For this reason, when a rotating body is installed to a space limited in either of the directions, there is a limit to the diameter of the rotating body. In this case, required moments must be generated with a rotating body with a small diameter. In order to generate a large moment with a rotating body with a small diameter, the rotating speed becomes significantly high, since a small moment of inertia requires a large angular acceleration. In general, motor speed is limited, and if a large current is used to achieve high-speed revolution with a motor with a small volume, heat generation becomes large as well. Furthermore, there is also an issue of high frequency oscillation during high-speed revolution if the center of gravity of the rotating body does not completely match the rotating axis.

SUMMARY OF THE INVENTION

The present invention is carried out in view of the above-described problems, and has an object of reducing effects of a driving reaction force by effectively canceling out the driving reaction force that is generated when a stage is driven. More specifically, the present invention has an object of making it possible to cancel out a moment reaction force around an axis parallel to a driving plane, which is generated when a stage is driven, or to reduce its effects.

According to one aspect of the present invention, a stage apparatus comprises a base, a stage that can move on a surface of the base, a first imparting unit that has a mass body that moves in a direction vertical to the surface and gives an inertia force to the base through a movement of the mass body, and a controlling unit that controls the movement of the mass body in the vertical direction in the first imparting unit, in accordance with a movement of the stage, so that a force that is generated in the base by the movement of the stage in a rotation direction around an axis parallel to the surface is reduced.

Furthermore, the present invention also provides a method for controlling the above-mentioned stage apparatus, an exposure apparatus that uses the above-mentioned stage apparatus, and a method for manufacturing a device that uses the exposure apparatus.

Further features of the present invention will become apparent from the following description of exemplary embodiments, with reference to the attached drawings.

BRIEF DESCRIPTION OF THE DRAWINGS

FIG. 3 is an illustration that shows a schematic structure of an exposure apparatus according to a first embodiment.

DESCRIPTION OF THE EMBODIMENTS

Figure 1:
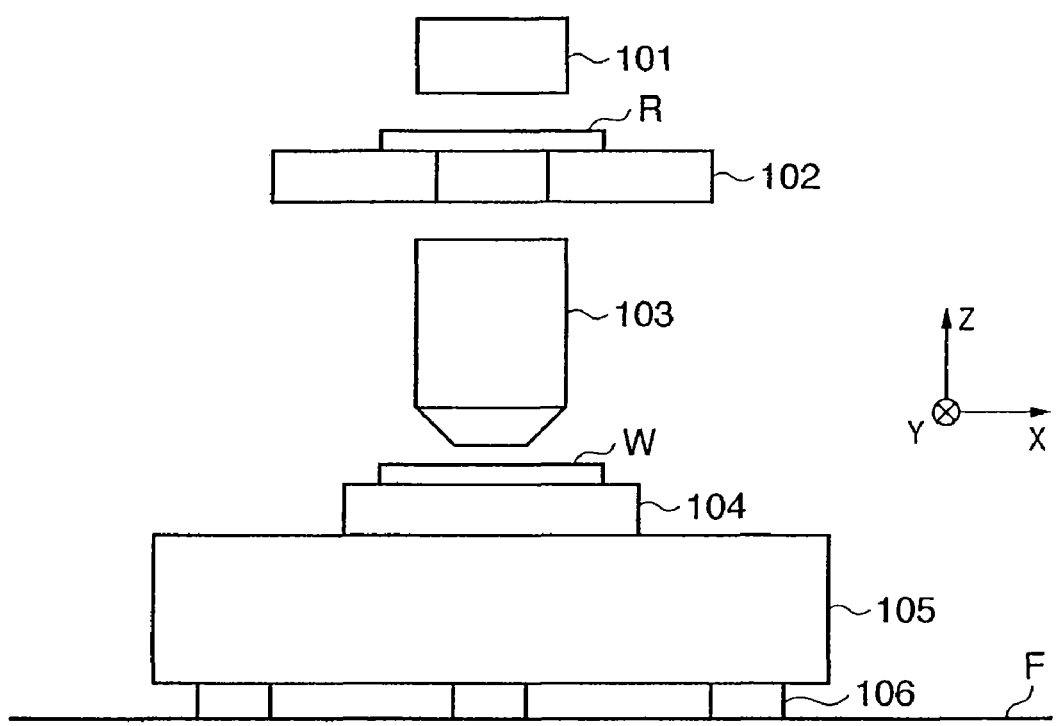
FIG. 1 is an illustration that describes a structure of a typical exposure apparatus.
Figure 2:
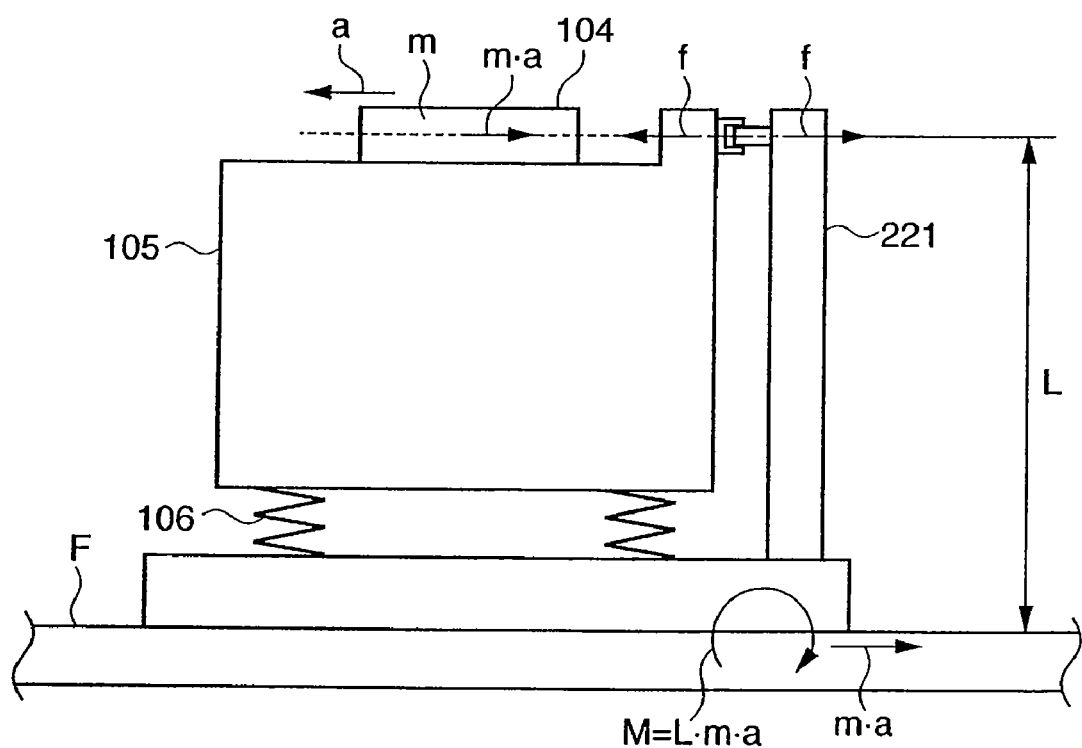
FIG. 2 is an illustration that describes a structure of a typical stage apparatus.

Preferred embodiments of the present invention will now be described in detail in accordance with the accompanying drawings.

First Embodiment

FIG. 3 is an illustration that shows a schematic structure of a scan type exposure apparatus according to this embodiment. A reticle base 302 that supports a reticle stage 301 is supported by a support frame 303 that is directly fixed to a floor face F. Exposure light for exposing a wafer W on a wafer stage 304 through a reticle on the reticle stage 301 is generated from a light source device 305, which is indicated with a dashed line. A frame 306 supports a projection optical system 307 between the reticle stage 301 and the wafer stage 304. Reference numeral 308 denotes a stator of a linear motor that accelerates and decelerates the reticle stage 301. The reticle stage 301 moves on the reticle base 302. A foundation bed 311 is fixed to the floor F and a base 312 is fixed onto the foundation bed 311. The wafer stage 304 moves on the base 312.

The wafer stage 304 has a driving unit that achieves synchronized scanning with the reticle stage 301. While the reticle stage 301 and the wafer stage 304 are driven for scanning, the respective positions are continuously detected with interferometers 309 and 310, and are supplied to the driving unit of the reticle stage 301 and the wafer stage 304, respectively. This makes it possible to accurately synchronize their scanning start points and to precisely control the scanning speed for a constant-speed scanning area.

Figure 4:
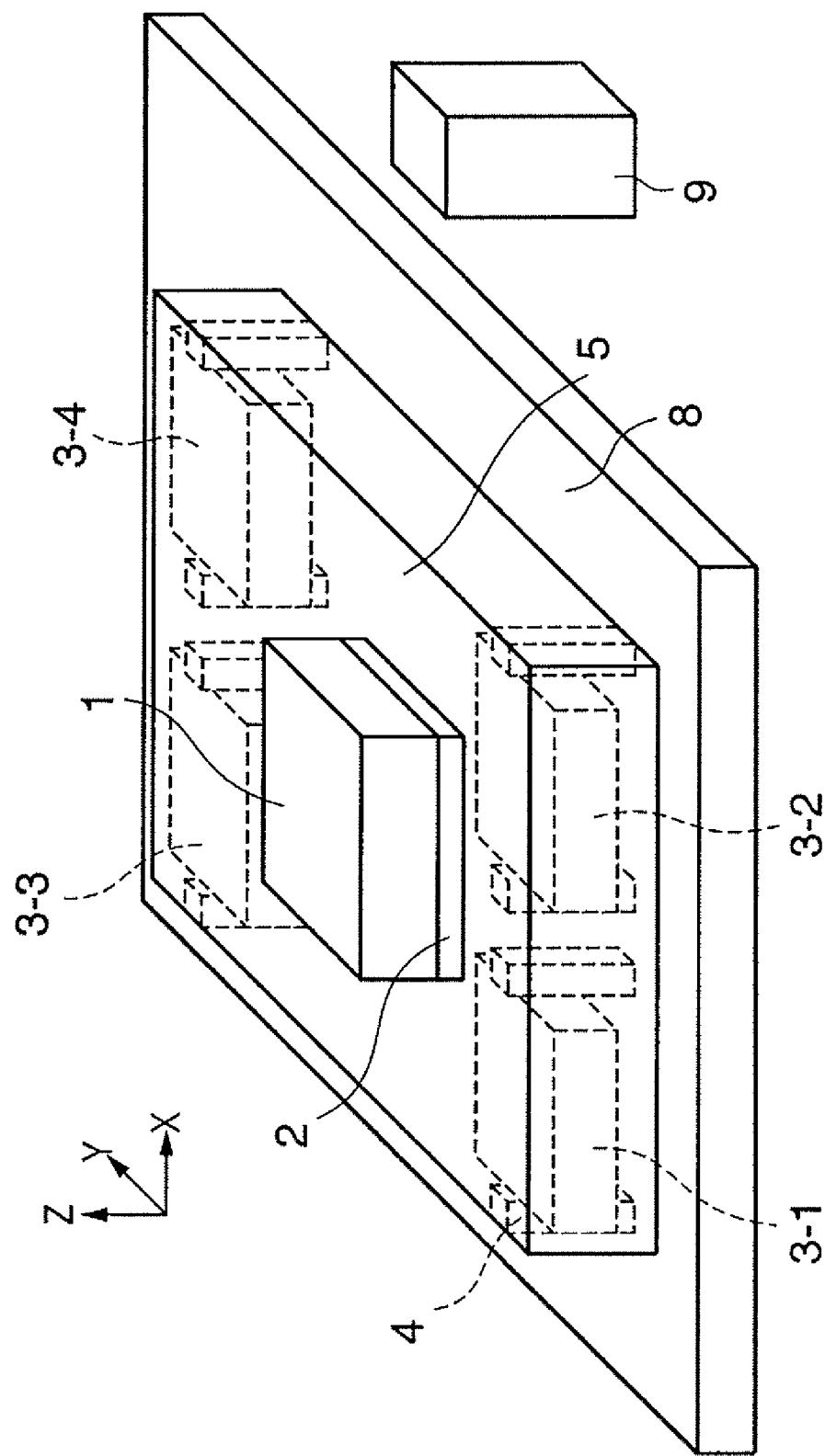
FIG. 4 is a schematic perspective view of a stage apparatus according to the first embodiment.

FIG. 4 is a perspective view that shows a schematic structure of a substantial portion of a stage apparatus according to this embodiment. In FIG. 4, new reference numbers are used for components, such as the stage and the base, so that a stage apparatus may be explained. If the stage apparatus shown in FIG. 4 is applied to the wafer stage system shown in FIG. 3, a stage 1, for example, corresponds to the wafer stage 304 in FIG. 3, a base 5 corresponds to the base 312, and a floor 8 corresponds to the foundation bed 311 and the floor F. The coordinate system is defined so that the XY axes are within the horizontal plane of the top face of the base 5 and the Z axis is in the direction perpendicular to the XY axes. The stage 1 moves on the top face of the base 5 that serves as a driving plane.

The base 5 is fixed onto the floor 8, and the stage 1 is supported along the top face of the base 5 through an air slide, so that it can freely move with two degrees of freedom in the directions X and Y. The stage 1 is attached to a stage actuator 2. The stage actuator 2 is a plane pulse servo motor (plane motor), and constitutes a magnetic circuit between the comb teeth provided on the top face of the base 5 to generate a thrust of the stage 1. Thus, a reaction force caused by movement (hereinafter, referred to as a movement reaction force) of the stage 1 is transferred to the base 5.

The base 5 has reaction force counters (mass body) 3-1 to 3-4 (the reaction force counters 3-1 to 3-4 are hereafter collectively referred to as reaction force counters 3) in its inside. The reaction force counters 3 are laid out so that, within the base 5, they can move in the direction Z, which is the direction vertical to the top surface of the base 5, with reaction force counter actuators 4. The reaction force counter actuators 4 are supported by the base 5. In this embodiment, an FL reaction force counter 3-1, an FR reaction force counter 3-2, a BL reaction force counter 3-3, and a BR reaction force counter 3-4 are installed within the base 5. As mentioned above, since each of the reaction force counters 3 is driven in the direction Z by the reaction force counter actuators 4 that have been attached to the base 5, movement reaction forces of the reaction force counters 3 are transferred to the base 5.

In general, when thrust axes of the reaction force counters 3 are not located at the center of gravity of the base 5 in terms of the YZ plane or the ZX plane, a moment can be generated for both the YZ plane and the ZX plane by driving the reaction counters 3 in the direction Z. Accordingly, if there are three or more reaction force counters 3, and if their respective thrust axis is not along a straight line on the XY plane and is not at the center of gravity of the base in terms of the YZ plane and the ZX plane, a moment of any size can be generated around both of the X axis and the Y axis. In other words, the movement of the counters 3 (mass body) in the vertical direction can be controlled in accordance with the movement of the stage 1, so that a force that is generated in the base 5 by the movement of the stage 1 in the rotation direction around the axis parallel to the surface of the base 5 is reduced. Thus, it is possible to simultaneously reduce or to cancel out both the moment around the X axis and the moment around the Y axis, which are generated through arbitrary driving of the stage 1 within the XY plane, with driving of the reaction force counters 3 in the direction of the Z axis. In this embodiment, the moments generated during movement of the stage 1 that is transferred from the base 5 to the floor 8, are reduced using four reaction force counters 3, so that the drive reaction force of the stage is reduced.

Figure 5:
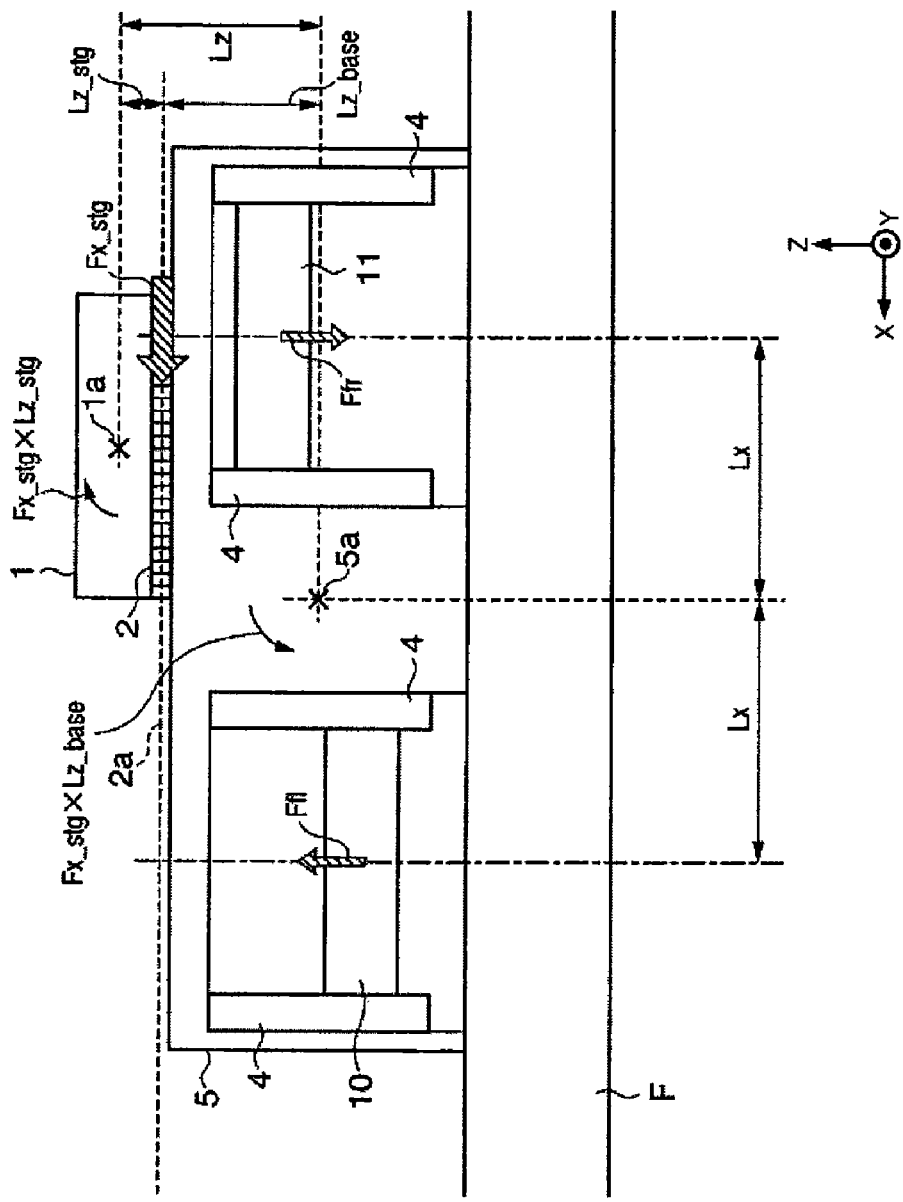
FIG. 5 is an illustration that explains how a moment force around a Y axis is cancelled out in a stage apparatus according to the first embodiment.

Hereafter, the principle of a method for reducing or canceling out a moment generated by a drive reaction force of the stage by driving the reaction force counters 3 in the direction Z will be explained with reference to FIG. 5.

Assuming the clockwise turn of the Y axis to be positive, the balance of the moments when the stage 1 is moved in the direction X with a thrust of Fx_stg is considered. In FIG. 5, the distance between a thrust axis 2a of the stage 1 and a center of gravity 1a of the stage is represented as Lz_stg. The distance between the thrust axis 2a and a center of gravity 5a of the base 5 is represented as Lz_base. Furthermore, a moment Fx_stg×Lz_stg that the stage 1 gives to the base 5 is represented as Qy_stg, a moment Fx_stg×Lz_base that is generated in the base by the thrust reaction force of the stage is represented as Qy_base, and a moment that the reaction forces counters 3 gives to the base is represented as Qy_cnt.

The balance of the moments inside of the stage 1 is represented by the following expression using the distance Lz_stg between the thrust axis 2a of the stage 1 and the center of gravity 1a of the stage 1.

$$Qy\_stg - Fx\_stg \cdot Lz\_stg = 0 \quad (1)$$

The balance of the moments on the base 5 is represented by the following expression using the distance Lz_base between the thrust axis 2a and the center of gravity 5a of the base 5.

$$Qy\_base - Fx\_stg \cdot Lz\_base - Qy\_stg + Qy\_cnt = 0 \quad (2)$$

At this point, the moment that should be generated by the reaction force counters 3 to achieve Qy_base=0, in other words, to eliminate transfer of the moment (moment around the Y axis) to the floor is calculated as follows:

$$Qy\_cnt = Fx\_stg \cdot (Lz\_stg + Lz\_base) \quad (3)$$

Likewise, the moment that should be generated by the reaction force counters 3 to prevent the moment around the X axis from being transferred to the floor is calculated with the following expression.

$$Qx\_cnt = Fy\_stg \cdot (Lz\_stg + Lz\_base) \quad (4)$$

Figure 6:
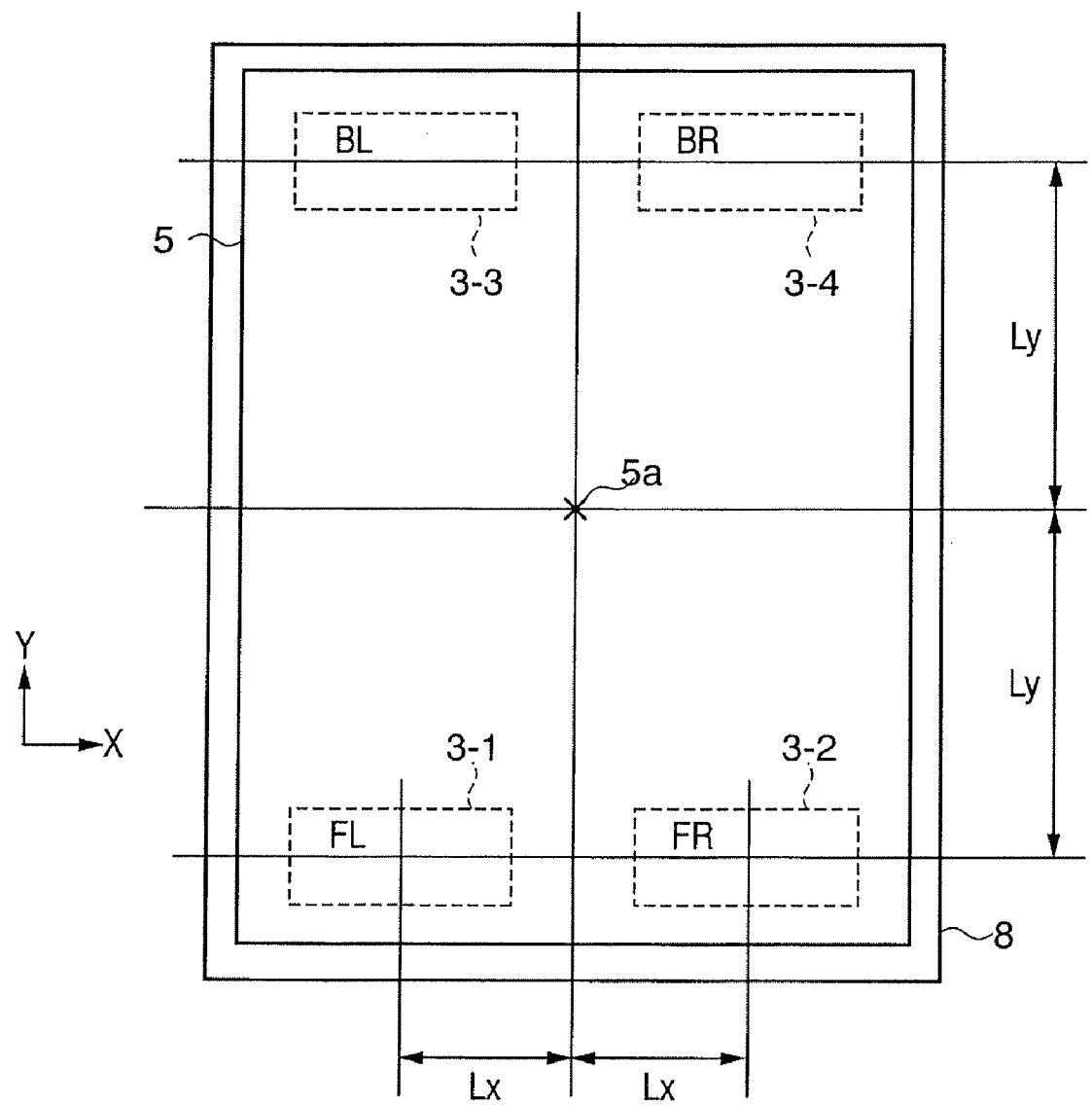
FIG. 6 is an illustration that describes a layout of reaction force counters in a stage apparatus according to the first embodiment.

At this point, with Lz=Lz_stg+Lz_base, as shown in FIG. 6, a configuration in which (the center of gravity of each of) the four reaction force counters 3-1 to 3-4 are laid out in a position Lx in the direction X and in a position Ly in the direction Y from the center of gravity 5a of the base 5 is considered. The thrusts of the FL counter force counter 3-1, the FR counter force counter 3-2, the BL counter force counter 3-3, and the BR counter force counter 3-4, in each case in the direction Z, are, respectively, represented as Ffl, Ffr, Fbl, and Fbr.

In this case, the balance of the moments around the Y-axis is represented as follows, based on the expressions (3) and (4).

$$(Ffr + Ffl - Fbr - Fbl) \cdot Lx = Fx\_stg \cdot Lz \quad (5)$$

Likewise, the balance of the moments around the X axis is represented as follows:

$$(Ffr + Fbr - Ffl - Fbl) \cdot Ly = Fy\_stg \cdot Lz \quad (6)$$

In addition, since it is also important to have the reaction force counters prevent a component z of the force from being transferred to the floor, driving takes place under the condition of the following expression (7), so that the total of the thrusts in the direction Z of the four reaction force counters equals zero.

$$Ffr + Ffl + Fbr + Fbl = 0 \quad (7)$$

Since there are four reaction force counters, the thrusts have four degrees of freedom, and since there are three conditional expressions to be satisfied (expressions (5) to (7)), there are an infinite number of methods for driving the reaction force counters 3 while satisfying them. The following is an example of this. In the example below, Fx_stg is written as Fx, and Fy_stg is written as Fy for simplification.

$$Ffl = (LyFx + LxFy) \cdot Lz / 4LxLy$$

$$Ffr = -(LyFx - LxFy) \cdot Lz / 4LxLy$$

$$Fbl = (LyFx - LxFy) \cdot Lz / 4LxLy$$

$$Fbr = -(LyFx + LxFy) \cdot Lz / 4LxLy \quad (8)$$

A control device 9 controls the reaction force counter actuators 4, so that the above-mentioned expressions are satisfied. For the reaction force counter actuators 4, linear motors, pulse motors, air actuators, and the like, can be used.

Since a force of gravity exists on the earth, a force −M_cnt·g is always applied to the reaction force counters in the direction Z, where g represents G-forces and M_cnt represents the weight of the reaction force counters 3. Since the size of the force is constant, by providing a mechanism for compensating for it, the reaction force counter actuators 4 only need to generate the thrust necessary to move the reaction force counters 3. For a gravity compensation mechanism, air pressure, hydraulic pressure, a magnet, a spring, and the like, can be used.

Furthermore, when the reaction force counters 3 are laid out, as shown in FIGS. 4 and 6, and the reaction force counters 3 are driven with the thrust indicated by the above-mentioned expression (8), the thrusts of the reaction force counters placed diagonally from each other are the same, but in the opposite directions. Thus, by connecting the FL reaction force counter 3-1 and the BR reaction force counter 3-4, as well as the FR reaction force counter 3-2 and the BL reaction force counter 3-3 with a wire, or the like, and hanging them from upper locations, gravity can be canceled out. Alternatively, gravity can also be cancelled out by connecting with an oil pressure cylinder or an air pressure cylinder, or the like, and supporting from below.

Figure 12:
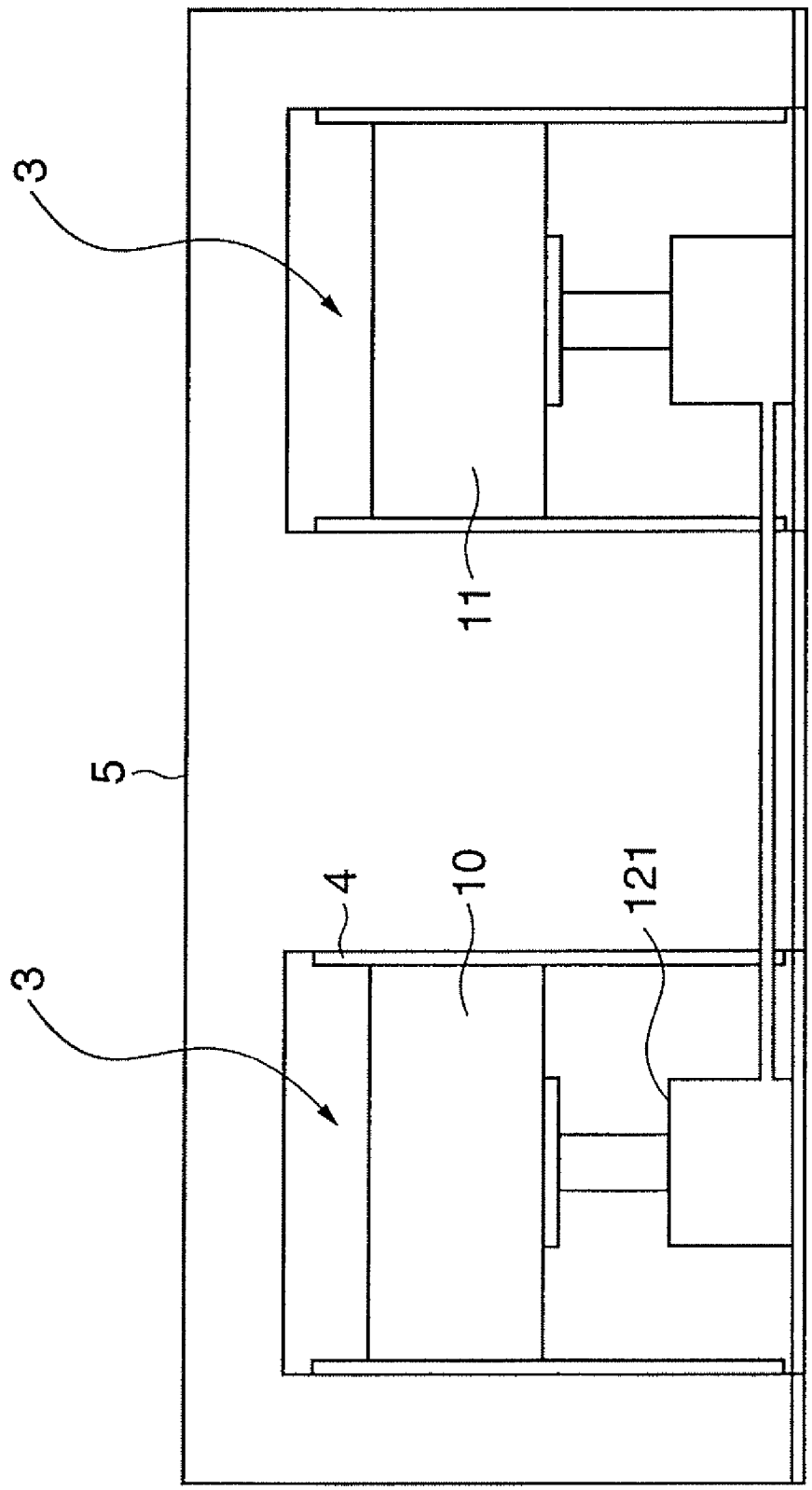
FIG. 12 is a schematic structural diagram that shows an example of a gravity compensation mechanism.

FIG. 12 shows an example of a gravity compensation mechanism of reaction force counters. In the reaction force counters 3 incorporated into the base 5, mass bodies 10 and 11 are driven up and down by the reaction force counter actuators 4. A gravity compensation mechanism can, for example, consist of air cylinders 121 that are connected with a pipe 122. Of course, the cylinders can be cylinders that utilize a liquid, such as a hydraulic type. In addition, for example, a cornice structure filled with air or a liquid may be used instead of the air cylinder.

Furthermore, when the stage also generates a force Fz in the direction Z, the force in the direction Z can also be cancelled out while keeping the balance with respect to moments by having each of the reaction force counters equally generate the force −Fz/4. This is represented by the following expressions.

$$Ffl = (LyFx + LxFy)Lz / 4LxLy - Fz/4$$

$$Ffr = -(LyFx - LxFy)Lz / 4LxLy - Fz/4$$

$$Fbl = (LyFx - LxFy)Lz / 4LxLy - Fz/4$$

$$Fbr = -(LyFx + LxFy)Lz / 4LxLy - Fz/4 \quad (9)$$

According to the above, when transfer of moments to an external component, such as the floor, is permitted to some extent, it is possible to make the thrust used larger or smaller than the thrust required to completely cancel out the moments. Accordingly, while suppressing the moments transferred to the outside to stay within the acceptable range, a force in the direction toward the center of the stroke of a reaction force counter is generated. In other words, the stroke in the direction Z of the reaction force counter can be shortened by making the force in the direction toward the stroke end smaller than the required thrust, and making the force in the direction away from the stroke end larger than the required thrust.

Figure 7:
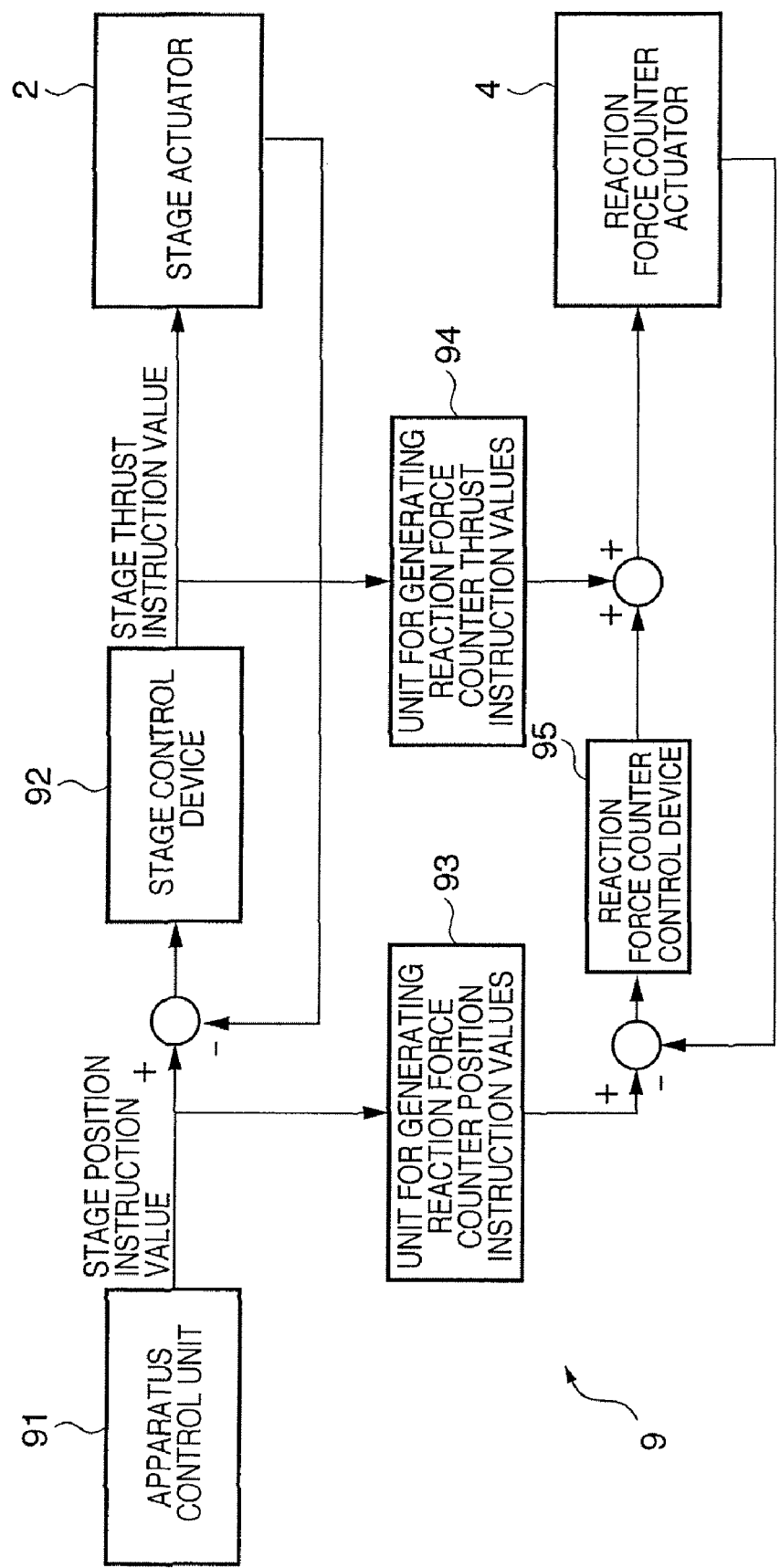
FIG. 7 is a diagram that explains a configuration for controlling an actuator that drives a reaction force counter.

FIG. 7 is a block diagram of an example of a control structure of the control device 9 related to the stage actuator 2 and the reaction force counter actuators 4. An apparatus control unit 91 controls the entirety of the exposure apparatus, and generates a stage position instruction value that instructs the position of the stage 1 for an exposure process. A stage control device 92 generates a stage thrust instruction value (Fx, Fy) by calculating the thrust necessary to drive the stage 1, based on the stage position instruction value and the feedback signals from the stage actuator 2, and sends this to the stage actuator 2. The stage actuator 2 drives the stage 1 in accordance with the stage thrust instruction value.

A unit 93 for generating reaction force counter position instruction values generates a position instruction value for the reaction force counters 3, based on the position instruction value of the stage 1 generated by the apparatus control unit 91. The unit 93 for generating reaction force counter position instruction values generates position instruction values for the reaction force counters 3 based on the stage position instruction value, the distance between the reaction force counters 3 and the center of gravity 5a (Lx, Ly), the weight of the counter (M_cnt), and the weight of the stage 1. A reaction force counter control device 95 generates a thrust instruction value for the reaction force counters 3 based on the position instruction value generated by the unit 93 for generating reaction force counter position instruction values and the feedback signal from the reaction force counter actuators 4. A unit 94 for generating reaction force counter thrust instruction values generates thrust instruction values for the reaction force counters based on the stage thrust instruction value generated by the stage control device 92 (Fx, Fy) and the distance between the reaction force counters 3 and the center of gravity 5a (Lx, Ly). The thrust instruction value outputs from the reaction force counter control device 95, and from the unit 94 for generating reaction force counter thrust instruction values, are combined and supplied to the reaction force counter actuators 4. The reaction force counter actuators 4 drive the reaction force counters 3 based on the combined thrust instruction value. Thus, Ffl, Ffr, Fbl, and Fbr mentioned in the above expression (8) are generated in the reaction force counters 3. The thrust instruction value of the reaction force counter actuators 4 may be set to be generated from a stage position instruction value alone, or from the end of the stage thrust instruction value. In other words, the thrust instruction value of the reaction force counter actuators 4 is generated utilizing any one or more of the current position, speed, and acceleration of the stage 1.

When adopting the expression (9), the unit 94 for generating reaction force counter thrust instruction values receives Fz from the stage control device 92 and generates thrust instruction values. Thus, the reaction force of the stage 1 is cancelled out with the position and thrust of the reaction force counters, and the reaction force counters are driven so that the range of driving stays within the determined stroke.

As mentioned above, according to the first embodiment, the reaction force counters 3 are moved in the vertical direction when the stage 1 moves, so that the forces that are generated in the base 5 by the movement of the stage 1 in the rotating direction around the X axis and the Y axis (around the axes parallel to the movement plane of the stage 1) are reduced. Thus, the rotation forces around the X axis and the Y axis, which are generated in the base 5 when the stage 1 moves, are cancelled out or reduced, which reduces vibrations transferred to the floor.

Second Embodiment

In the first embodiment, a structure, which can cancel out moments around the X axis and the Y axis that are generated by the movement of the stage 1 and can cancel out a reaction force applied in the direction Z, is explained. In the second embodiment, a structure for canceling out translational forces in the directions X and Y, which are generated when the stage 1 is driven (a structure for canceling out a translational force along the top face of the base 5 that is generated by the movement of the stage 1), is added. In addition, in the second embodiment, a structure for canceling out a moment around the Z axis (in other words, a structure for reducing a force that is generated in the base 5 in the rotation direction with respect to the axis vertical to the top face of the base 5) is added.

Figure 8:
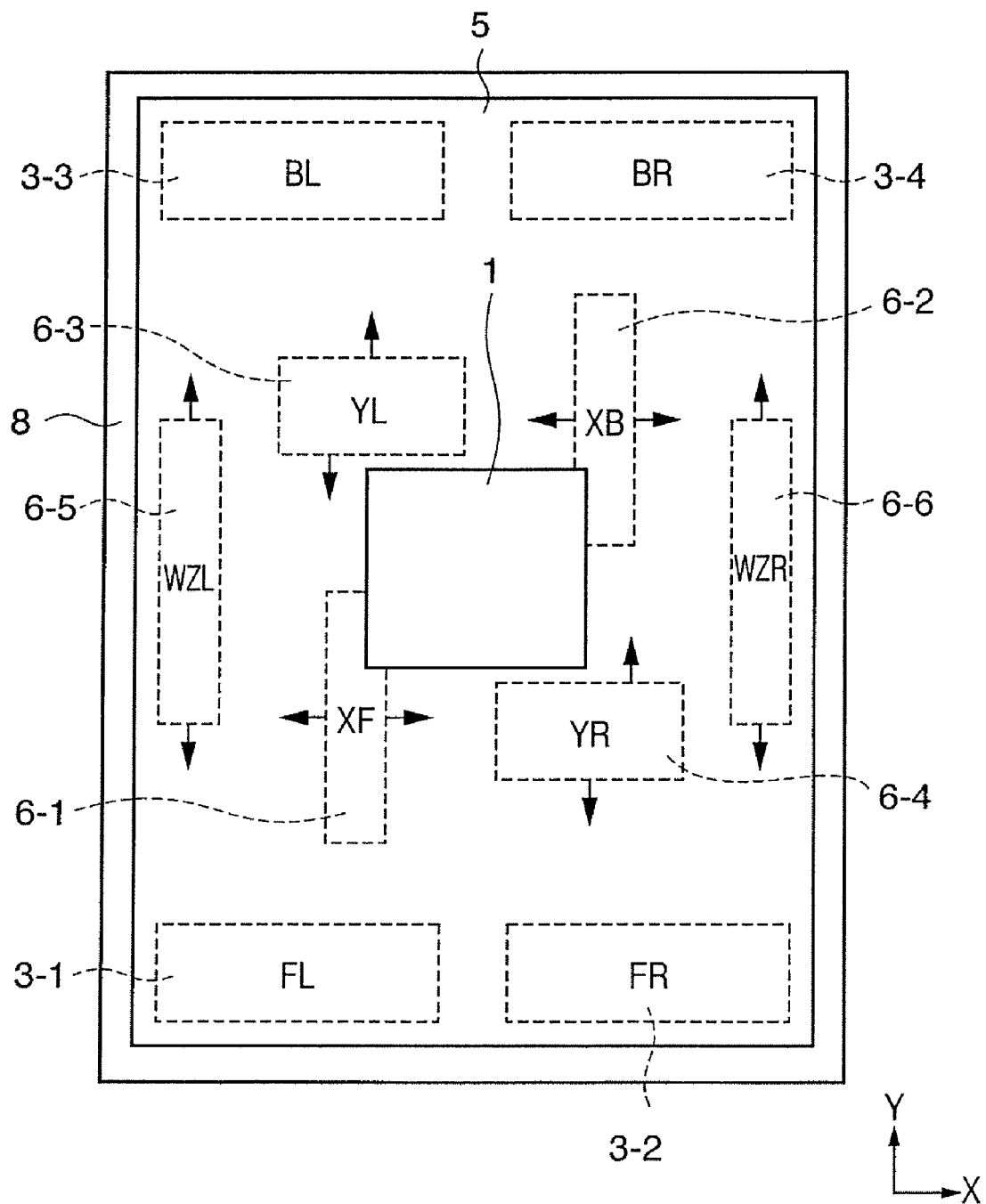
FIG. 8 is an illustration that describes a layout of reaction force counters in a stage apparatus according to a second embodiment.
Figure 9:
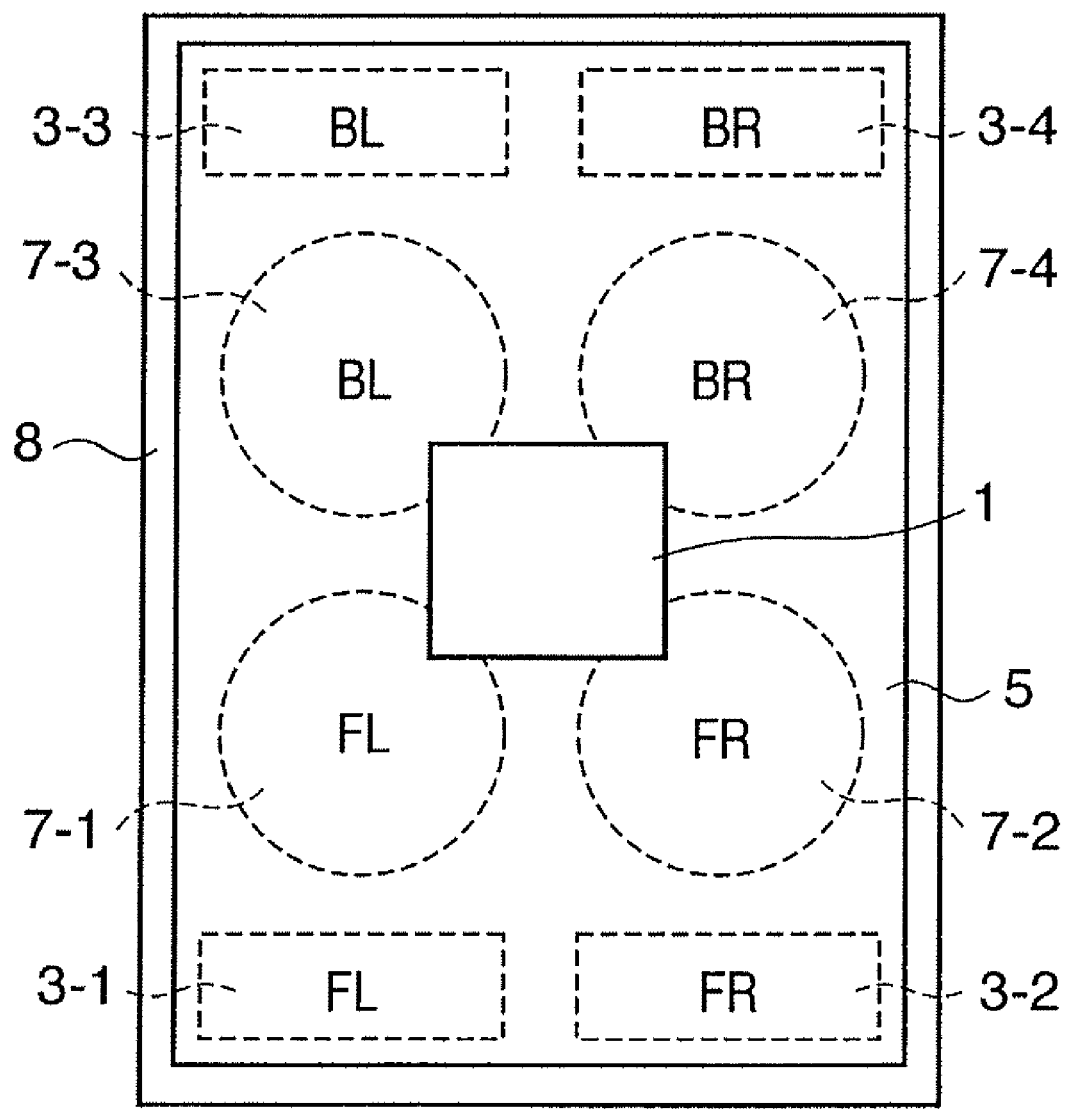
FIG. 9 is an illustration that explains a layout of reaction force counters in a stage apparatus according to a third embodiment.

FIG. 8 is an illustration that shows an example of a layout of reaction force counters according to the second embodiment. In the second embodiment, the base 5 has four types of reaction force counters in its inside. As explained in the first embodiment, reaction force counters 3-1 to 3-4 can move in the direction Z, and cancel out, not only the moment around the X axis and the moment around the Y axis, but also, the force in the direction Z. An XF reaction force counter (mass body) 6-1 and an XB reaction force counter (mass body) 6-2 can respectively move in the direction X, and cancel out a translational force X that is generated when a stage 1 is driven. A YL reaction force counter (mass body) 6-3 and a YR reaction force counter (mass body) 6-4 can respectively move in the direction Y, and can cancel out a translational force Y that is generated when the stage 1 is driven. A WZL reaction force counter (mass body) 6-5 and a WZR reaction force counter (mass body) 6-6 can respectively move in the direction Y, and cancel out a moment around the Z axis that is generated when the stage 1 is driven.

Here, a thrust of the stage 1 in the direction X is represented as Fx_stg, a thrust in the direction Y is represented as Fy_stg, and XY coordinates of the stage 1 (center of gravity 1a) with a center of gravity 5a of the base 5 as an origin point is represented as (Xstg, Ystg). The Y coordinates of the WZL reaction force counter 6-5 and the WZR reaction force counter 6-6 (position of the center of gravity) are represented as Ywzl and Ywzr. The sum of the thrusts in the direction X of the XF reaction force counter 6-1 and the XB reaction force counter 6-2 is represented as Fx_cntx, and the sum of the thrusts in the direction Y of the YL reaction force counter 6-3 and the YR reaction force counter 6-4 is represented as Fy_cnty. Furthermore, a thrust in the direction Y of the WZL reaction force counter 6-5 is represented as Fy_cntwzl, and a thrust in the direction Y of the WZR reaction force counter 6-6 is represented as Fy_cntwzr. Then, the thrust to be generated by each of the reaction force counters can be expressed as follows.

$$Fx\_cntx = Fx\_stg$$

$$Fy\_cnty = Fy\_stg$$

$$Fy\_cntwzr = (Fx\_stg \cdot Ystg - Fy\_stg \cdot Xstg)/2Ywzl$$

$$Fy\_cntwzr = (Fx\_stg \cdot Ystg - Fy\_stg \cdot Xstg)/2Ywzr \quad (10)$$

The thrusts of the FL counter force counter 3-1, the FR counter force counter 3-2, the BL counter force counter 3-3, and the BR counter force counter 3-4 are the same as those in the first embodiment (expression (8) or expression (9)).

In other words, a control device 9 cancels out the translational force in the direction X that is generated by the movement of the stage 1 by controlling the sum of the thrusts in the direction X of the XF reaction force counter 6-1 and of the XB reaction force counter 6-2 to be Fx_cntx in the expression (10). In addition, the translational force in the direction Y that is generated by the movement of the stage 1 is cancelled out by controlling the sum of the thrusts in the direction Y of the YL reaction force counter 6-3 and of the YR reaction force counter 6-4 to be Fy_cnty in the expression (10). The rotation force (moment) around the Z axis, which is generated by the movement of the stage 1, is cancelled out by controlling the thrust in the direction Y of the WZL reaction force counter 6-5 to be Fy_cntwzl in the expression (10) and the thrust in the direction Y of the WZR reaction force counter 6-6 to be Fy_cntwzr in the expression (10).

As mentioned above, according to the second embodiment, in addition to the effects of the first embodiment, a translational force within the XY plane that is generated when the stage 1 is driven and a moment around the Z axis can be cancelled out.

Third Embodiment

Hereafter, the third embodiment will be explained. In the third embodiment, a reaction force counter is not used in canceling out a translational force that is generated by the movement of the stage 1. Furthermore, a moment around the Z axis, which is generated by the movement of the stage 1, is cancelled out using a rotor laid out within a base 5. The rotor is a mass body in a disc form, and is in a structure in which a stator is fixed to the base 5, and the rotor (rotator) is provided within the base 5 so that it rotates.

First, the base 5 is structured in a way it can move freely in the directions X and Y as opposed to the floor 8, so that the base 5 can move as a force Fx in the direction X and a force Fy in the direction Y are transferred to the base 5 as the stage 1 moves, preventing the forces from being transferred to the floor.

In other words, the base 5 is supported in a way that it can move two-dimensionally so that the base moves when a thrust reaction force of the stage 1 is applied. Accurate positioning is possible by providing a measuring device (such as a laser interferometer) to an immovable part that is supported on the floor, so that the position of the stage 1 is measured using the floor coordinates as a reference, to allow accurate measurement, even when the base 5 moves. Furthermore, since the base 5 moves, the stage 1 needs an extra thrust that is equivalent to the acceleration of the base 5.

The relationship of acceleration between the above-mentioned stage 1 and the base 5 in terms of the floor coordinate system is, as follows, shown as equation (11a).

$$Fx\_base = Fx\_stg$$

$$m\_base \cdot Acc\_base = m\_stg(Acc\_stg + Acc\_base) \quad (11a)$$

In the above-mentioned expressions, Acc_base and Acc_stg are the absolute values of acceleration of the base 5 and the stage 1 in terms of the floor coordinate system, respectively.

Since the base 5 moves, the thrust required for the stage 1 is a relative speed between the stage 1 and the base 5. In other words, the acceleration generated in the base 5 by the reaction force that is generated when the stage 1 moves at Acc_stg in terms of the floor coordinate system is as follows.

$$Acc\_base = Acc\_stg \cdot m\_stg/(m\_base - m\_stg) \quad (11b)$$

The base 5 has reaction force counters and rotors laid out in its inside. The reaction force counters are, as in the first embodiment, to cancel out the moment around the X axis, which is movable in the direction Z and the moment around the Y axis, and include an FL reaction force counter 3-1, an FR reaction force counter 3-2, a BL reaction force counter 3-3, and a BR reaction force counter 3-4. In addition, the base 5 includes four rotors: an FL rotor (mass body) 7-1, an FR rotor (mass body) 7-2, a BL rotor (mass body) 7-3, and a BR rotor (mass body) 7-4, so that the rotation of these rotors can generate in the base 5 a moment around the Z axis. In the third embodiment, the reaction force counters 3-1 to 3-4, which are driven in the Z direction, cancel out or reduce the moment around the X axis and the moment around the Y axis, which is generated in the base 5 by the movement of the stage 1. The rotors 7-1 to 7-4 reduce the moment around the Z axis that is generated in the base 5 by the movement of the stage 1.

A thrust of the stage 1 in the direction X is represented as Fx_stg, a thrust in the direction Y is represented as Fy_stg, and XY coordinates of the center of gravity 1a of the stage 1 with a center of gravity 5a of a base 5 as an origin point are represented as (Xstg, Ystg). In addition, the sum of the thrusts in the direction X applied to the base 5 is represented as Fx_base, and the thrusts in the direction Y is represented as Fy_base. In addition, the moment around the Z axis that the rotors 7-1 to 7-4 should generate is represented as Qz_rotor. In this case, the reaction force in the directions X and Y and the moment around the Z axis, which are generated when the stage 1 moves, are cancelled out or reduced by driving the base 5 in the directions X and Y and by driving the rotors 7-1 to 7-4, as shown in the following expression (11c).

$$Fx\_base = Fx\_stg$$

$$Fy\_base = Fy\_stg$$

$$Qz\_roter = Fx\_stg \cdot Ystg - Fy\_stg \cdot Xstg \quad (11c)$$

The moment around the X axis and the moment around the Y axis of the base 5, which is generated by the movement of the stage 1, as well as the thrust of the reaction force counters 3-1 to 3-4 for canceling out or reducing the force applied in the direction Z are the same as those in the first embodiment.

As explained above, according to the first to the third embodiments, by using the reaction force counters 3 that generate the thrust in the direction Z, the moment around the X axis and the moment around the Y axis of the base that is generated by the movement of the stage 1, as well as the force applied in the direction Z, can be cancelled out or reduced. Since reaction force counters that move in the direction Z are used, compared to a conventional structure in which a rotating body is used, the installation space for the reaction force counters is more flexible, and their shape can be flexibly modified in accordance with limitations of the location for installation.

Furthermore, as shown in FIG. 4, canceling out the moments around the X axis and the Y axis by installing reaction force counters in a space, which is long in the directions X and Y and short in the direction Z, is considered. In this case, stroke in the direction Z when the moment is generated can be shortened by adopting a shape that is long in the direction X, so that the weight becomes heavier for the reaction force counters. Although the counters are laid out so that it is long in the direction X in FIG. 4, if it is in a shape that is longer in the direction Y than in the direction X, the reaction force counters may be laid out so that it is longer in the direction Y.

In addition, since the reaction force counters 3 are driven only in one direction, minor deviations in the center of gravity of the components to be driven do not cause high frequency oscillation. As shown in FIG. 4, when the stage 1 and the reaction force counters 3 are supported by the base 5, it is desirable to make the lengths Lx and Ly between the center of gravity 5a of the base 5 and the thrust axis of the reaction force counters 3 longer. This is because it can generate a large moment with a small thrust and is advantageous in terms of electrical power consumption and heat generation.

As explained above, according to a stage apparatus according to each of the above-mentioned embodiments, the moments transferred from a base to outside can be reduced by generating moments to reaction force counters. Furthermore, the moments of pitching and rolling generated by a plane motor are reduced at the same time with the reaction force counters that are driven in the direction Z. For example, by laying out reaction force counters, as shown in FIG. 6, the moments of pitching and rolling (moments around the X axis and the Y axis) are simultaneously reduced. Furthermore, when there are a plurality of a reaction force counters, only the moment can be transferred to the base as the reaction force counters as a whole without generating a translational force (expression (8)). This makes it possible to precisely position a stage, and also to reduce effects on other devices nearby, such as disturbance caused by floor vibration.

Furthermore, since an exposure apparatus according to the above-mentioned embodiments uses the above-mentioned stage, high-speed and precise positioning of wafers and reticles can be expected, and throughputs will improve. In addition, owing to the reduced vibration of the apparatus itself, effects of vibrations on other devices nearby, such as disturbance, can be reduced.

In the first to third embodiments, a case in which a stage apparatus shown in FIG. 4 is applied to a wafer stage shown in FIG. 3 is explained, but it can also be applied to a reticle stage. In this case, the reticle stage 301 corresponds to the stage 1, and the reticle base 302 corresponds to the base 5. The support frame 303 corresponds to the floor 8. Thus, a stage apparatus according to the above-mentioned embodiments can be applied to a wafer stage of a step-and-repeat type exposure apparatus, as well as to a wafer stage and/or a reticle stage of a step-and-scan type exposure apparatus. In the above-mentioned embodiments, the reaction force counters are laid out within the base 5, but the reaction force counters and actuators may be installed to the outer periphery of the base 5.

Furthermore, in the above-mentioned embodiments, the base 5 has a single stage mounted on it, but the embodiments can also be applied when a plurality of stages are installed to the base 5. In this case, the reaction force counters 3 are to be driven to reduce or cancel out the sum of the moments generated from the drive reaction force of the plurality of stages.

<Application to a Method of Manufacturing a Device>

Figure 10:
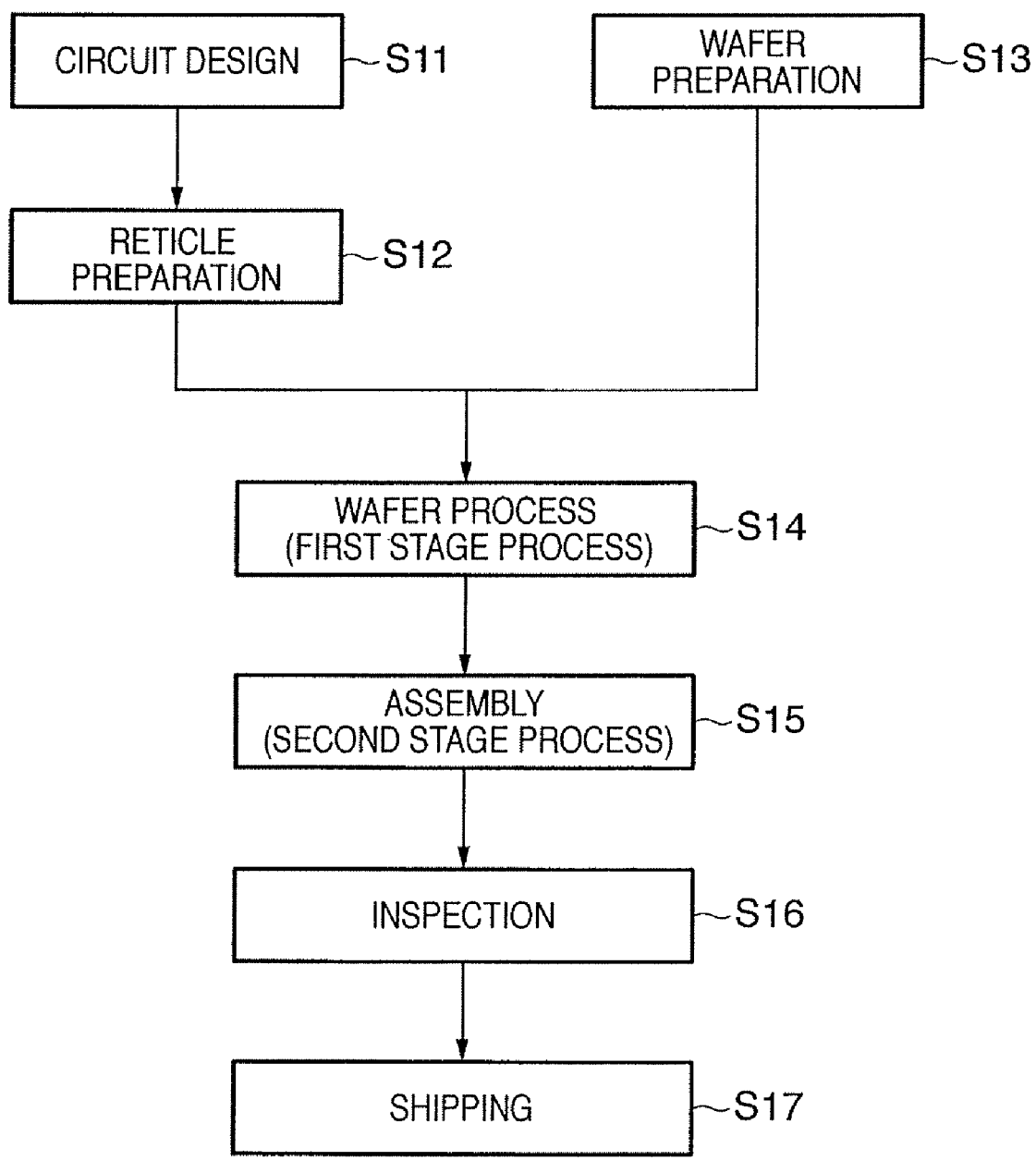
FIG. 10 is a flow chart of a wafer process.

Hereafter, an embodiment for a method of manufacturing a semiconductor device using the above-mentioned exposure apparatus will be explained. FIG. 10 is a flow chart showing a manufacturing process for manufacturing a semiconductor device (for example, a semiconductor chip, such as ICs and LSIs, a liquid crystal panel, a CCD, a thin film magnetic head, and a micro machine). In a step S11 (circuit design), a circuit of a semiconductor device is designed. In a step S12 (reticle preparation), a reticle on which the designed circuit pattern is formed is prepared. Meanwhile, in step S13 (wafer preparation), a wafer, as a substrate, is manufactured using materials such as silicon. Step S14 (wafer process) is referred to as a first stage process in which, using the prepared reticle and wafer, an actual circuit is formed on the wafer with lithography technology. The subsequent step, step S15 (assembly), is referred to as a second stage process in which semiconductor chips are fabricated using wafers produced in the step S14, and includes an assembly step (dicing and bonding) and a packaging process (chip sealing). In step S16 (inspection), inspections, such as an operation test and a durability test, are performed on the semiconductor device prepared in step S15. When semiconductor devices are completed after going through these steps, they are shipped (step S17).

Figure 11:
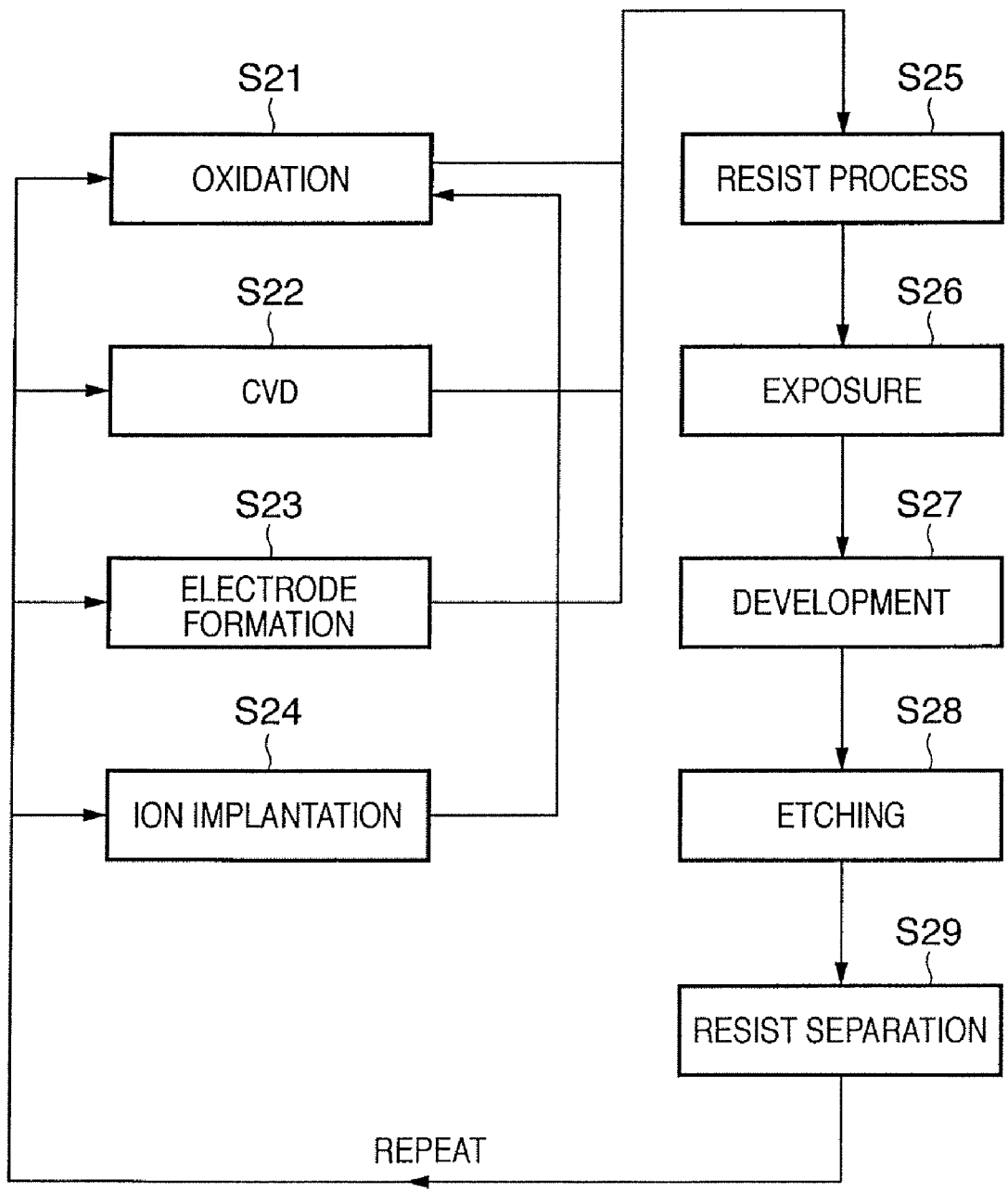
FIG. 11 is a flow chart of a method for manufacturing a semiconductor device.

FIG. 11 is a detailed flow chart of the above-mentioned wafer process. In step S21 (oxidation), the surface of the wafer is oxidized. In step S22 (CVD), an insulating film is formed on the surface of the wafer. In step S23 (electrode formation), an electrode is formed on the wafer through vapor deposition. In step S24 (ion implantation), ions are implanted to the wafer. In step S25 (resist treatment), a photosensitive agent is applied to the wafer. In step S26 (exposure), the circuit pattern of the reticle is exposed and printed on the wafer using the above-explained exposure apparatus. In step S27 (development), the exposed wafer is developed. In step S28 (etching), portions other than the developed resist images are etched away. In step S29 (resist separation), the resists that became unnecessary after completion of etching are removed. Multiply-layered circuit patterns can be formed on the wafer by repeating these steps. By using a manufacturing method according to this embodiment, a high density semiconductor device can be manufactured.

According to the present invention, it is possible to reduce effects of drive reaction forces, by effectively canceling out a drive reaction force generated when a stage is driven. More specifically, a moment reaction force around an axis parallel to a driving plane, which is generated when a stage is driven, is cancelled out or its effects are reduced.

While the present invention has been described with reference to exemplary embodiments, it is to be understood that the invention is not limited to the disclosed exemplary embodiments. The scope of the following claims is to be accorded the broadest interpretation, so as to encompass all such modifications and equivalent structures and functions.

What is claimed is:

1. A stage apparatus comprising:
    a base;
    a stage that can move on a surface of the base;
    an imparting unit arranged inside the base, which has a mass body and an actuator that is fixed to the base and moves the mass body in a direction vertical to the surface, the imparting unit being configured to apply a force to the base by moving the mass body; and
    a controlling unit that controls movement of the mass body in the vertical direction in the imparting unit in accordance with movement of the stage, so that a force, which is generated in the base by the movement of the stage in a rotational direction around an axis parallel to the surface, is reduced.

2. The apparatus according to claim 1, further comprising a plane motor for driving the stage formed between the stage and the base.

3. The apparatus according to claim 1, wherein the controlling unit generates a drive command value of the mass body by utilizing a drive command value of the stage.

4. The apparatus according to claim 3, wherein the controlling unit determines a thrust of the mass body in the vertical direction based on a thrust of the stage in a direction along the surface of the base, and a distance between a center of gravity of the stage and a center of gravity of the base.

5. The apparatus according to claim 3, wherein the controlling unit generates a drive command value of the mass body by utilizing at least one selected from the current position, speed, and acceleration of the stage.

6. The apparatus according to claim 1, further comprising a gravity compensation mechanism that gives a force to the mass body in a direction opposite to the gravity.

7. The apparatus according to claim 1, wherein the imparting unit has a plurality of mass bodies and a total sum of thrusts of the plurality of mass bodies in the vertical direction is zero.

8. The apparatus according to claim 1, wherein the base is provided so as to be movable in a direction along the surface, and the movement of the base reduces a translational force along the surface that is generated by the movement of the stage.

9. The apparatus according to claim 1, further comprising a plurality of stages provided on the base, wherein the controlling unit controls the movement of the mass body in the vertical direction in the imparting unit in accordance with the movement of the plurality of stages, so that a resultant force in a rotational direction around an axis parallel to the surface, which is generated in the base by the movement of the plurality of stages, is reduced.

10. An exposure apparatus comprising:
    a light source that emits exposure light;
    the stage apparatus according to claim 1, wherein the stage of the stage apparatus is used as a wafer stage that moves with a wafer mounted thereon;
    a reticle stage for mounting a reticle; and
    an optical system that forms, on a wafer on the wafer stage, an image of a reticle pattern that is mounted on the reticle stage.

11. A method of manufacturing a device, the method comprising:
    a step of exposing a pattern to a substrate using the exposure apparatus according to claim 10; and
    a step of developing the exposed substrate.

12. A stage apparatus comprising:
    a base;
    a stage that can move on a surface of the base in a first direction and a second direction that is orthogonal to the first direction;
    a plurality of imparting units arranged inside the base, which each have a mass body and an actuator that is fixed to the base and moves the mass body in a direction vertical to the surface, each imparting unit being configured to apply a force to the base by moving the mass body, wherein at least one imparting unit is placed in each of four areas of the base, which are obtained by dividing the base with a plane that is in the first direction and orthogonal to the surface and includes a center of gravity of the base, and a plane that is in the second direction and orthogonal to the surface and includes a center of gravity of the base; and a controlling unit that controls the movement of each mass body in the vertical direction in accordance with the movement of the stage, so that a force, which is generated in the base by the movement of the stage in rotational directions around axes parallel to the first and second directions, is reduced, wherein the controlling unit controls the movement of each mass body, so that two imparting units placed diagonally from each other, among the four imparting units placed in four areas, impart forces to the base that have the same absolute value, but opposite directions, wherein the two imparting units placed diagonally from each other are connected with a wire and hung from an upper location.

* * * * *